United States Patent [19]

Atarashi et al.

[11] 4,301,231

[45] Nov. 17, 1981

[54] NEGATIVE RESIST FOR HIGH ENERGY RADIATION

[75] Inventors: Yuji Atarashi; Mutsuo Kataoka, both of Kamakura, Japan

[73] Assignee: Toray Industries, Incorporated, Tokyo, Japan

[21] Appl. No.: 121,914

[22] Filed: Feb. 15, 1980

[51] Int. Cl.$^3$ ............................................. G03C 1/68
[52] U.S. Cl. .................................. 430/287; 430/270; 430/296; 427/43.1; 204/159.13; 526/242; 526/279
[58] Field of Search ..................... 430/287, 296, 270; 427/43.1; 204/159.13; 526/279, 242

[56] References Cited

U.S. PATENT DOCUMENTS

| | | | |
|---|---|---|---|
| 2,982,757 | 5/1961 | Lewis | 526/279 |
| 3,657,164 | 4/1972 | Jastrow et al. | 526/279 |
| 4,151,158 | 4/1979 | Poddubny et al. | 204/159.13 |

OTHER PUBLICATIONS

Yatsui et al., J. Electrochem. Soc. Solid State Science, vol. 116, No. 1, pp. 94–97, Jan. 1969.

*Primary Examiner*—Jack P. Brammer
*Attorney, Agent, or Firm*—Scully, Scott, Murphy & Presser

[57] ABSTRACT

Negative resist materials comprising soluble, film-forming polymers with side branches containing vinyl silyl groups are used for pattern generation on exposure to high energy radiation such as electron beams or X-rays.

5 Claims, No Drawings

NEGATIVE RESIST FOR HIGH ENERGY RADIATION

BACKGROUND OF THE INVENTION

This invention relates to negative resist materials for generating resist patterns by application of high energy radiation such as electron beams or X-rays.

Fabrication of printed and integrated circuitry generally includes one or a series of processing steps in which surface regions are pattern delineated by selective material removal. Such removal, whether accomplished by use of chemical reagents, either acidic or basic, or by machining, for example, ion milling, utilizes masks or "resists". Such resists, generally adherent to the surface being processed, in accordance with this procedure define a negative image of the pattern to be delineated.

In accordance with general practice to date, resist patterns are generated in light sensitive coatings by flooding with ultraviolet light through a master mask in contact with or spaced from the coating, followed by development in an agent which differentiates between exposed and unexposed material.

However, along with the demand for finer and more complicated patterns, it has been found that there exists an essential limit in the pattern forming technique using ultraviolet light and light sensitive materials. To remove this limit and to meet such demand, a new pattern forming technique is being developed and practically applied which uses electron beams and electron beam sensitive materials, or X-rays and X-ray sensitive materials.

According to such technique using X-rays or electron beams, as compared with the conventional method using ultraviolet light, there can be obtained finer patterns and the possibility exists that the pattern accuracy will be increased. However, since the said technique requires an expensive equipment, it is necessary that the production be made in a highly efficient manner. Especially as to radiation sensitive materials, those superior in sensitivity are required. To attain a high pattern accuracy, moreover, it is necessary to provide materials which are superior in contrast. In addition, various other conditions are required of radiation sensitive materials such as operationability, e.g. thin film formation, film quality, e.g. adhesion of coating to substrate as well as its thermal stability and etch-resistance, and shelf like.

Heretofore there have been proposed many radiation sensitive materials for the pattern formation using electron beams and X-rays. However, a material which satisfies the aforesaid conditions, particularly both sensitivity and contrast, has not been known yet.

Polysiloxane with a vinyl group attached to a silicon atom in the main chain is known as a material for pattern formation using electron beams. However, since the main chain is a nonorganic chain, such polysiloxane is inferior in its adhesion to substrate, and the resulting pattern is coarse.

Conventional vinyl group-containing polymers, moreover, show the tendency that an attempt to form a pattern at high speed results in lowering of resolution and that the pattern formed is inferior in accuracy. Such polymers are further disadvantageous in that an attempt to increase sensitivity causes lowering of stability, that the performance is debased during storage and that they are easily affected by visible rays.

It is an object of this invention to overcome the abovementioned drawbacks.

It is another object of this invention to provide new negative resist materials useful for ultrafine pattern generation on exposure to high energy radiation such as electron beams or X-rays.

Other objects of this invention will become apparent from the following description.

SUMMARY OF THE INVENTION

According to this invention, there is provided a resist material useful for pattern generation by the application of radiation, said resist material consisting essentially of a soluble, film-forming organic polymer with side branches at least some of which contain vinyl silyl groups.

In the resist materials of this invention it is essential that silyl group-containing branches be existent from the main polymer chain. Particularly, it is preferable that the said polymer contain per gram thereof at least $3 \times 10^{-5}$ equivalent of vinyl groups attached to silicon atoms and that the weight average molecular weight thereof be not less than 2,000. Such vinyl silyl groups are not attached directly to the chain but are separated by a at least one atom, usually including a carbon atom.

A preferred vinyl silyl group-containing branch is represented by the following general formula:

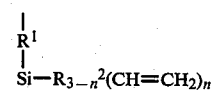

wherein $R^1$ is a divalent organic bonding joining the main chain and silicon atom, $R^2$ is a monovalent organic group other than vinyl group, and n is an integer of 1 to 3.

The negative resist materials of this invention not only have a high sensitivity to radiation such as electron beams and X-rays, but also exhibit a high contrast. Besides, they eliminate such unstability as is observed in conventional vinyl groups, undergo less change in performance even in long-term storage, and are less sensitive to visible rays thus making their storage possible even in a light place without likelihood of performance deterioration.

An ultrafine pattern can be obtained by coating a negative resist material according to this invention onto a substrate and exposing the so-formed coating to radiation through a predetermined pattern to generate a latent image, followed by treatment with a solvent and dissolving away unexposed portion.

DETAILED DESCRIPTION OF THE INVENTION

The vinyl silyl group-containing polymer which constitutes the negative resist materials of this invention is solvent-soluble and has a film forming property. Its weight average molecular weight is preferably not less than 2,000 and not more than 5,000,000. Usually employed are of a reduced viscosity, $\eta sp/C$, ranging from about 0.1 to about 3.0 measured using organic solvents such as dimethylformamide, methyl ethyl ketone, and toluene. As to the main polymer chain, its kind, molecular chain length and chain length distribution may be selected freely if only the polymer chain is an organic chain. By chagning these conditions, the sensitivity characteristics, film quality and development characteristics can be varied over a wide range.

The main chain is principally a straight chain, the existence of branching or intermolecular crosslinking being generally not preferred from the standpoint of sensitivity characteristics. But polymers wherein such conditions exist are also employable in the invention.

As the main polymer chain, typical is a carbonaceous chain. A carbonaceous chain containing hereto atoms, such as polyether, polyimine, polysulfide, polyamide, polyester, polyurethane, polycarbonate, polyurea, cellulose, amylose and dextrane, is also preferred.

The $R^1$ in the foregoing formula which joins the main polymer chain and a vinyl silyl group essentially is not specially restricted if only it is an organic bonding, but preferably consists of a condensed bonding (hereinafter referred to a "A") directly attached to the main polymer chain such as —COO—, —OCO—, —CONH—, —CH$_2$OCO—, or —OCH$_2$CH$_2$OCO—, and a divalent aliphatic or aromatic hydrocarbon bonding (hereinafter referred to as "$R^3$") attached to Z such as (CH$_2$)$_{1-8}$, —CH=CH—, —C=C—, —CH$_2$C=C—,

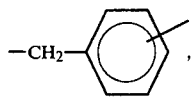

phenylene, or any of these bondings with hydrogens partially substituted by alkyl or aryl. That is, the said $R^1$ is preferably a bonding represented as —Z—$R^3$—.

The $R^2$ in the same formula is preferably an alkyl group having not more than four carbon atoms such as methyl, ethyl or propyl, specially preferably being methyl group.

Furthermore, the n therein is preferably 1 or 2.

As to the content of vinyl silyl groups, it is preferable that the polymer contain per gram thereof $3 \times 10^{-5}$ equivalent or more (in terms of vinyl groups attached to silicon atoms) of vinyl silyl groups, with its upper limit not specially defined. $5 \times 10^{-4}$ to $1 \times 10^{-2}$ is specially preferred.

The negative resist materials used in the invention can be prepared basically by two methods. One method is to prepare a monomer having a vinyl silyl group within the molecule and also having a polymerizable group other than vinyl silyl group and polymerize the monomer. In case vinyl group is used as the polymerizable group, it is important to take note of the difference in reactivity from silyl vinyl group which is a radiation sensitive group, and to adopt means which would affect the radiation sensitive group as less as possible. On the other hand, in case the polymerizable group is amino, carboxyl or hydroxyl group and can be converted to a polymer by condensation polymerization, the influence on the radiation sensitive group is generally smaller than in vinyl polymerization, but attention should be paid to the polymerization temperature. At extremely high temperatures, e.g. 150° C. or higher, the radiation sensitive group sometimes reacts. In this respect, the surface polycondensation at a low temperature is an advantageous melthod. Ring opening polymerization and addition polymerization can also be utilized for the polymer preparation.

The other basic method for preparing the negative resist materials of the invention utilizes a polymer reaction. More particularly, the combination of a polymer having a reactive group X with a compound having a reactive group Y and containing a vinyl silyl group is utilized, and by the reaction of X and Y the vinyl silyl group is attached to the polymer chain. This method is often advantageous in that by the selection of X-Y combination the reaction can be carried out in relatively mild conditions, and in that in the case of preparing the starting polymer by polymerization reaction it is not necessary to consider the influence of the polymerization reaction upon vinyl silyl group.

In preparing the negative resist materials by such polymer reaction, it is necessary that the starting polymer (trunk polymer) used contain a reactive group X. But the other structures of the polymer may be optional. According to the kind of the reactive group X, there arises the necessity of selecting the kind of the reactive group Y of the compound which contains the radiation sensitive group. For example, when either X or Y is hydroxyl group, the other is carboxyl, isocyanate, carbonyl halide, sulfonyl halide, or carboxylate group.

A wide variety of such combinations are known and all of them can be utilized for preparing the radiation sensitive materials used in the method of this invention.

In the starting polymer used in such polymer reaction, in addition to a carbonaceous chain containing only carbon atoms as in vinyl polymers, the main chain thereof may contain hereto atoms, for example, polyether, polyimine and polysulfide. Furthermore, there may exist in the main chain such bondings as amide, ester, urethane, carbonate and urea bondings.

Natural polymers such as cellulose, amylose and dextrane and derivatives thereof are also employable in addition to synthetic polymers.

The structure of main chain of these polymers affects the development characteristics and film quality of the resulting negative resist materials.

Typical polymer reactions are as follows:

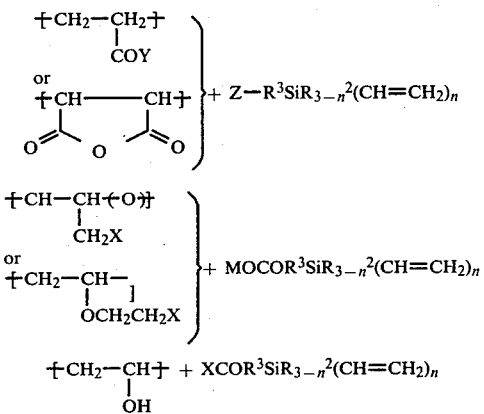

wherein X is halogen, Y is an active group such as X,

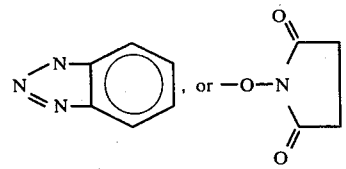

Z is —NH$_2$ or —OH, M is an alkali metal, $R^2$, $R^3$ and n are as previously defined.

More concrete examples of polymer reaction are shown below.

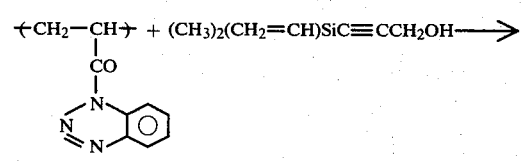
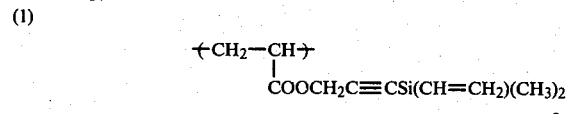
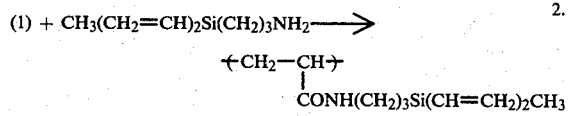
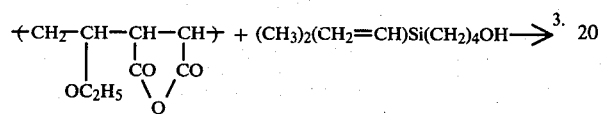
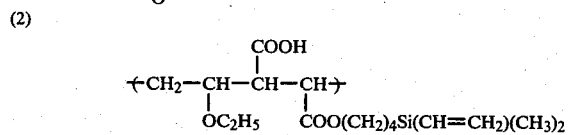
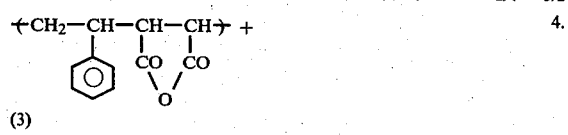
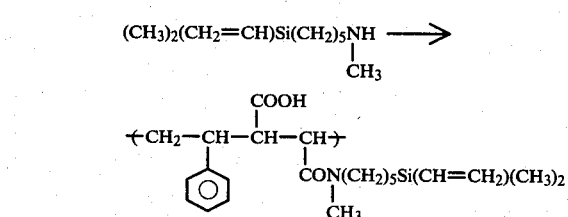
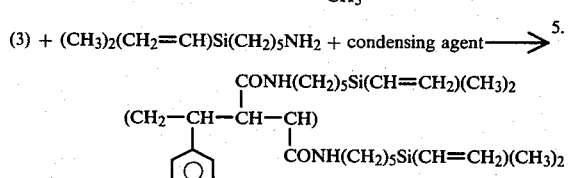
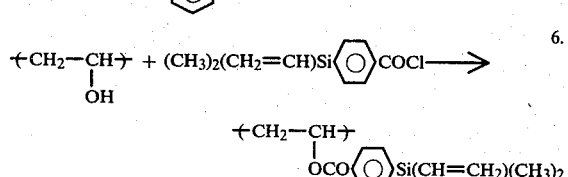
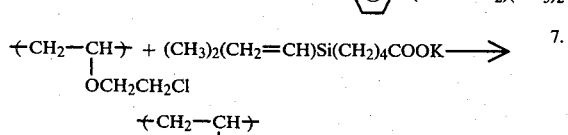
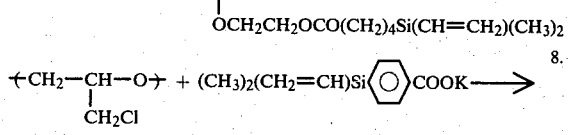
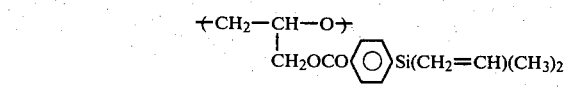
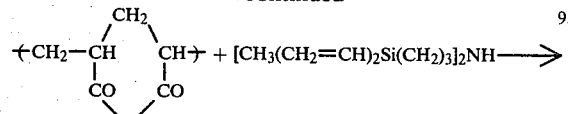
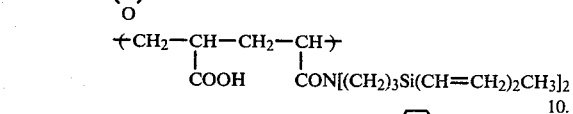
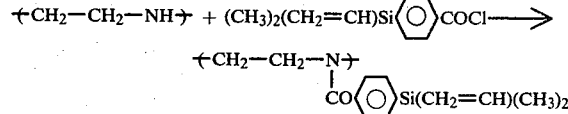
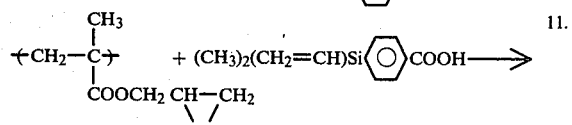
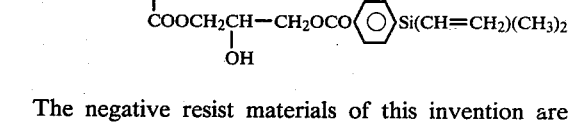

The negative resist materials of this invention are used in the fabrication of patterns in generally known manner.

Polymer is dissolved in a suitable solvent to prepare a polymer solution. In this case, the solvent to be used should be selected according to the properties of the polymer. That is, for polymers containing ester-, amide- or ether bonding, the use of chlorinated hydrocarbons such as chlorobenzene, or esters such as butyl acetate and methyl cellosolve acetate, is preferred. And for polymers further containing carboxyl or hydroxyl group in addition to the aforesaid groups, the use of non-protonic polar solvents such as dimethylformamide, or alcohols such as n-butanol, is preferable.

The polymer solution is filtered through a filter with a pore size of $0.2\mu$ or less and then poured onto a substrate set on a spinner. As the substrate there may be used known ones, for example, a glass plate with chromium or chromium oxide vapor-coated thereon, or a silicon wafer. By rotating the spinner at 500 to 10,000 rpm there is formed a uniform coating on the substrate. The coating is prebaked to remove solvent and enhance adhesion. The prebaking is usually carried out at a temperature of 50° to 120° C. for a period of 5 to 30 minutes. Equivalent results are obtained by prebaking in vacuum or in an inert gas atmosphere such as nitrogen. The conditions for prebaking should be selected so that the solvent is removed and the polymer does not undergo crosslinking.

In electron beam exposure, electron beams of 10 to 30 KeV may be used, with the amount of electricity ranging from $4\times10^{-8}$ to $5\times10^{-6}$ coulomb/cm$^2$, which may be selected according to the sensitivity of polymer. Usually the amount of electricity is selected so that the half of the coating thickness is left after development. The amount of electricity in this case corresponds to $Q_{0.5}$ (as will be referred to later).

After exposure, development is carried out in a suitable solvent by the conventional immersion or spray development technique. Any developing solvents may be used if only they dissolve the polymer used, but those which cause insolubilized portion to swell too much should be avoided. For a carboxyl group-containing polymer there is selected methanol, ethanol, propanol, or a mixture thereof with a small amount of water. Development is carried out usually for 10 seconds to 5 minutes with temperature set at 10° to 30° C., which is immediately followed by rinsing. A rinsing liquid is applied to contract the swollen, insolubilized portion and to wash away the remaining polymer. For the aforesaid carboxyl group-containing polymer there may be used an aqueous acetone or aqueous methyl ethyl ketone.

After development and rinsing, the resist pattern formed is post-baked to improve adhesion to the substrate. The post-baking usually is conducted at 60° to 200° C. for 5 minutes to 1 hour. Also, this baking step may be applied in vacuum or in an inert gas such as nitrogen.

The so-formed resist pattern is then subjected to etching according to the kind of substrate. For example, the pattern formed on a chromium substrate is etched for 1 to 2 minutes at 25° C. using an etching solution consisting of ceric ammonium nitrate and acetic acid.

In the working examples of the invention given below, the numerical values of polymer viscosity were obtained by measurement at the concentration of 0.5 g/100 cc and at the temperature of 25° C. using a dimethylformamide solvent. And the values of sensitivity characteristics were obtained in the following manner.

Polymers were dissolved in suitable solvents and spin-coated onto NESA glass in known manner to form thin films of 0.3 to 0.8μ thick. Then using an electron beam exposure system ("JBEX-2B," a product of Nippon Denshi Co.), many spots were exposed to an electron beam at an accelerating voltage of 30 KV with varying exposure doses. After exposure, development was carried out using solvent suited to the respective polymers, and on each spot the relative value of film thickness after development (assuming the saturation value of remaining film thickness when a sufficiently large exposure dose has been given, to be 1) was determined by multiple beam interferometry.

A senstivity characteristic curve was drawn by plotting logarithmic values of the amount of electricity for exposure ($C/cm^2$) along the axis of abscissa and plotting relative values of remaining film thickness along the axis of ordinate. In the said sensitivity characteristic curve, the exposure dose of electron beam corresponding to the relative value 0.5 of remaining film thickness was taken to be a sensitivity $Q_{0.5}$ ($C/cm^2$), and the gradient of tangential line at this point on the sensitivity characteristic curve was taken to be a contrast $\gamma_{0.5}$.

EXAMPLE 1

1.50 g. of poly(N-acryloylbenztriazole) ($\eta sp/C=1.70$). was dissolved in 20 ml of dimethylformamide, into which were added 1.8 ml of triethylamine and 3.4 g. of 3-(dimethylvinylsilyl)propargyl alcohol, and after mixing thoroughly the mixture was held at 60° C. for 20 hours. After standing to cool, the reaction mixture was poured into 1 l of methanol, then the deposited polymer was filtered off and washed with methanol. On drying at room temperature under reduced pressure a hard rubbery polymer resulted (yield 1.35 g.). The results of elementary analysis were as follows.

|  | C (%) | H (%) | Si (%) |
| --- | --- | --- | --- |
| Found | 61.81 | 7.19 | 13.8 |
| Calculated | 61.82 | 7.26 | 14.44 |

The above calculated values were obtained from the composition of $C_{10}H_{14}O_2Si$ on the basis of the following reaction.

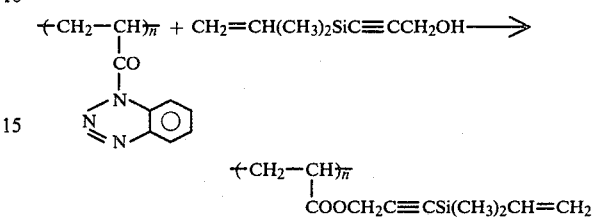

The $\eta spC$ of this polymer was 1.73 and the density of vinyl silyl groups was $4.91 \times 10^{-3}$ equivalent/g. The sensitivity characteristics to an electron beam at an accelerating voltage of 30 kV were as follows.
$Q_{0.5} = 1.6 \times 10^{-7}$ coulomb/cm$^2$
$\gamma_{0.5} = 0.75$ A solution of the polymer in cellosolve acetate was applied onto NESA plate (indium oxide film) in known manner using a spinner (Mikasa 2H-2) to form a uniform coating 6500 Å thick. On this film was put a metallic mesh with a line width of about 6μ and an electron beam exposure was made using an electron beam at an accelerating voltage of 30 kV and at a dose of $3.3 \times 10^{-7}$ coulomb/cm$^2$. Then, development was carried out by immersing the MESA plate in a (1:1) mixture of methyl isobutyl ketone and n-butyl acetate at 25° C. for 30 seconds to form a clear mesh pattern.

EXAMPLE 2

From poly(N-acryloylbenztriazole) ($\eta spC=1.70$) and 3-dimethylvinylsilyl-1-phenylpropargyl alcohol there was prepared a polymer by the following reaction in accordance with the procedure described in Example 1.

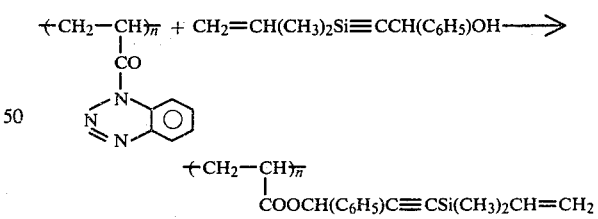

After completion of the reaction, the polymer was isolated and purified in accordance with the procedure described in EXample 1.

The results of elementary analysis were as follows.

|  | C (%) | H (%) | Si (%) |
| --- | --- | --- | --- |
| Found | 70.83 | 6.96 | 9.82 |
| Calculated ($C_{16}H_{18}O_2Si$) | 71.08 | 6.71 | 10.38 |

The sensitivity characteristics were as follows.
$Q_{0.5} = 2.6 \times 10^{-7}$ coulomb/cm$^2$
$\gamma_{0.5} = 0.93$ The ηspC was 1.52 measured at 25° C. and at a concentration of 0.5 g/100 cc in dimethylformamide solvent. The content of vinyl groups attached to silicon atoms was $3.50 \times 10^{-3}$ equivalent/g. The polymer was dissolved in n-butyl acetate to form a 10% solution thereof, which solution was applied onto NESA plate in accordance with the method described in Example 1 to form a uniform coating 5300 Å thick. Then electron beam exposures were made at a dose of $5 \times 10^{-7}$ coulomb/cm² and at $1 \times 10^{-6}$ coulomb/cm², respectively, followed by development for 45 seconds using a mixed (9:1) solvent of isobutyl acetate and n-propanol, to give clear mesh patterns.

EXAMPLE 3

From poly(N-acryloylbenztriazole)(ηsp/C=1.70) and 4-(dimethylvinylsilyl) butanol there was prepared a silicon-containing polymer by the following reaction in accordance with the procedure described in Example 1.

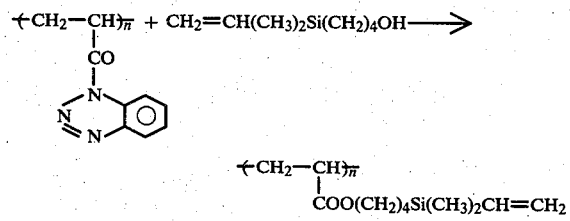

The polymer was subjected to elementary analysis, the results of which were as follows.

|  | C (%) | H (%) | Si (%) |
| --- | --- | --- | --- |
| Found | 61.86 | 9.25 | 12.81 |
| Calculated ($C_{11}H_{20}O_2Si$) | 62.22 | 9.49 | 13.22 |

According to calculation from the above analysis, the polymer contained $4.56 \times 10^{-3}$ equivalent/g of vinyl group, and the reduced viscosity ηsp/C as 1.50.

The sensitivity characteristics to a 30 kV electron beam were as follows.

$Q_{0.5} = 9.7 \times 10^{-8}$ coulomb/cm²
$\gamma_{0.5} = 0.80$

Using a solution of the polymer in n-butyl acetate there was prepared onto NESA plate a pattern consisting of 1.3μ wide parallel lines at a line spacing of 3.71μ. Then development was carried out for 60 seconds using n-propyl acetate under such conditions that the accelerating voltage of electron beam was 20 kV and the average exposure dose for the area to be exposed was $3.0 \times 10^{-7}$ coulomb/cm². As a result, a clear pattern was obtained.

EXAMPLE 4

From poly(N-acryloylbenztriazole)(ηspC=1.70) and 3-(dimethylvinylsilyl)-3-phenylpropanol there was prepared a polymer with side branches containing vinyl silyl groups by the following reaction in the same manner as in Example 1.

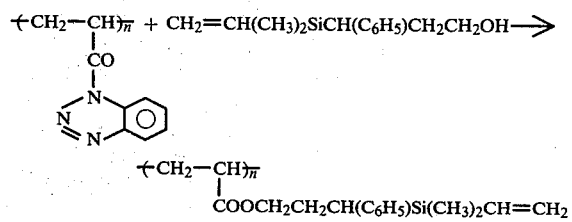

The polymer was subjected to elementary analysis to give the following results.

|  | C (%) | H (%) | Si (%) |
| --- | --- | --- | --- |
| Found | 69.60 | 8.22 | 9.76 |
| Calculated ($C_{16}H_{22}O_2Si$) | 70.03 | 8.03 | 10.23 |

According to calculation from the above elementary analysis, the polymer contained $3.47 \times 10^{-3}$ equivalent/g of vinyl groups, and the reduced viscosity ηsp/C was 1.60.

The polymer proved to have the following sensitivity characteristics to a 30 kV electron beam.

$Q_{0.5} = 1.8 \times 10^{-7}$ coulomb/cm²
$\gamma_{0.5} = 0.98$

The polymer was dissolved in n-butyl acetate so that its concentration was 5 g/100 cc. The polymer solution thus prepared was applied, in known manner using a spinner, onto a chromium substrate with a 700 Å thick metallic chromium film and further with a thin gold film formed thereon, to form a uniform polymer film. The spinner revolution was 1000 r.p.m. and the polymer film thickness was about 0.5μ. Using an electron beam exposure system, JBX-4S, a product of Nippon Denshi Co., there was formed a TI pattern with an electron beam at an accelerating voltage of 20 kV. Line width, electron beam scanning width and beam current were 1μ, 0.9×0.9 mm and 0.5 nA, respectively. After exposure there was applied a developing treatment with ethyl acetate for 2.5 minutes, followed by treatment with ethanol, to give a clear pattern. The pattern was etched by ion shower using an ion shower milling machine manufactured by Elionix Co. and using argon as the ion source under the conditions of 0.8 kV and 13 mA. Thereafter, the polymer was swollen in solvent and removed. Through a microscope was observed a clear gold pattern on the substrate.

EXAMPLE 5

3.0 g. of styrene-maleic anhydride alternating copolymer (with an intrinsic viscosity of 0.77 in methyl ethyl ketone at 25° C.) was dissolved in 17 ml of dimethylformamide, and 7.0 g. of 3-(dimethylvinylsilyl)propargyl alcohol was added. The solution was heated in an oil bath at 120° C. for 5.5 hours. Thereafter, the reaction product was poured into methanol; as a result, a fibrous polymer slightly tinged with brown color precipitated. The polymer was filtered off, washed with methanol and then dried under reduced pressure to yield 3.0 g. of a light brown polymer. The silicon content of this polymer was analyzed to be 1.35%. Calculation from this numerical value showed that 11 mole % of 3-(dimethylvinylsilyl)-propargyl alcohol reacted per repeating unit of the alternating polymer. Consequently, the content of vinyl groups attached to silicon atoms was $4.81 \times 10^{-4}$ equivalent/g.

The sensitivity characteristics to an electron beam at an accelerating voltage of 30 kV were as follows.

$Q_{0.5} = 1.6 \times 10^{-6}$ coulombcm$^2$
$\gamma_{0.5} = 0.85$

A solution of the polymer in dimethylformamide was applied onto NESA plate, and a mesh pattern was formed in accordance with the procedure described in Example 1, which pattern was clear.

EXAMPLE 6

2.3 g. of the styrene-maleic anhydride alternating copolymer used in Example 5, 9.2 g. of 4-(dimethylvinylsilyl)butanol and 12 ml of dimethylformamide were mixed together and then heated in an oil bath at 150° C. for 6 hours. After standing to cool, the reaction product was poured into methanol to allow polymer to precipitate, which polymer was filtered off, washed several times with petroleum benzine and then dried to yield 2.6 g. of a somewhat brownish polymer. The silicon content of the polymer was analyzed to be 4.1%, and the content of vinyl groups attached to silicon atoms in the polymer was $1.46 \times 10^{-3}$ equivalent/g. The reduced viscosity $\eta$sp/C was 1.50.

The polymer proved to have the following sensitivity characteristics.

$Q_{0.5} = 1.3 \times 10^{-7}$ coulomb/cm$^2$
$\gamma_{0.5} = 0.61$

The procedure described in Example 1 was repeated using as solvent a (1:1) mixture of dimethylformamide and and n-butanol and using n-propanol as a developer; as a result, a mesh pattern could be reproduced with high accuracy.

EXAMPLE 7

From ethylene-maleic anhydride alternating copolymer and 3-(dimethylvinylsilyl)propargyl alcohol there was prepared a silicon-containing polymer in accordance with the procedure described in Example 6. The silicon content of the polymer was analyzed to be 4.75%, with the content of vinyl groups adjacent to silicon atoms corresponding to $1.69 \times 10^{-3}$ equivalent/g, and the reduced viscosity of the polymer was 0.68. To a 30 kV electron beam the polymer showed a sensitivity of $Q_{0.5} = 2.2 \times 10^{-7}$ coulomb/cm$^2$. In the fabrication of a mesh pattern with a line width of 6$\mu$, which was carried in accordance with the procedure described in Example 1, there could be obtained a good pattern at an exposure dose of $5.0 \times 10^{-7}$ coulomb/cm$^2$ and using butanol as a developer.

EXAMPLE 8

From ethyl vinyl ether-maleic anhydride alternating copolymer and p-(dimethylvinylsilyl)benzylamine there was prepared a silicon-containing polymer with side branches containing vinyl silyl groups. The silicon content of the polymer was 7.64%, with the content of vinyl groups adjacent to silicon atoms corresponding to $2.72 \times 10^{-3}$ equivalent/g, and the reduced viscosity was 1.37.

The sensitivity characteristics to a 30 kV electron beam were as follows.

$Q_{0.5} = 1.12 \times 10^{-7}$ coulomb/cm$^2$
$\eta_{0.5} = 1.01$

A solution of the polymer in n-butanol was applied onto NESA plate to form a thin film 7200 Å thick. On the film surface there was delineated a pattern of holographed Chinese characters using an electron beam at an accelerating voltage of 20 kV and a beam current of 0.3 nA. The delineated area was $0.95 \times 0.95$ mm in which were contained four Chinese characters. After exposure, a developing treatment was applied for 60 seconds with acetone as a developer, followed by drying. With a red laser light incident vertically on the film surface, there could be reproduced clear characters.

EXAMPLE 9

From ethylene-maleic anhydride alternating copolymer and 4-(dimethylvinylsilyl)butanol there was prepared a polymer having a silicon content of 5.03%, a vinyl group content of $1.73 \times 10^{-7}$ equivalent/g and a reduced viscosity of 0.73. The polymer was dissolved in a mixed solvent of dimethylformamide and n-butanol, and the resulting polymer solution was applied onto NESA plate by means of a spinner to form a thin film 6800 Å thick. The thin film was covered with the metallic mesh used in Example 1 and then exposed to soft X-rays (molybdenum target) of 5.4 Å wavelength at a dose of $1 \times 10^3$ millijoule/cm$^2$, followed by development with n-butanol, to give a clear mesh pattern.

EXAMPLE 10

40 g. of ethyl vinyl ether-maleic anhydride copolymer ($\eta$sp/C = 1.33) was dissolved in 800 ml of acetone, and a molecular weight fractionation was performed using n-hexane and benzene to remove 44% high molecular weight fraction and 34% low molecular weight fraction leaving 22% intermediate fraction. ($\eta$sp/C = 1.01).

621 mg of the polymer after fractionation was dissolved in 15 ml of acetonitrile, and a mixture of 700 mg 4-(dimethylvinylsilyl)butanol and 5 ml acetonitrile was added, followed by further addition of 420 mg triethylamine dissolved in 3 ml acetonitrile. After standing for 18 hours at room temperature, 0.5 ml of a concentrated hydrochloric acid was added and the solution was poured into 400 ml of a 0.5% diluted hydrochloric acid. After stirring for 1 hour, water was decanted off, the polymer was dissolved in 5 ml of acetone and re-precipitated in cylohexane. Subsequent drying under reduced pressure afforded 0.89 g. of a white polymer. The silicon content of the polymer was analyzed to be 5.5% and the content of vinyl groups adjacent to silicon atoms was $1.96 \times 10^{-3}$ equivalent/g.

The polymer was dissolved in a (1:1) mixture of dimethylformamide and n-butanol, and the resulting solution was applied onto a silicon wafer by means of a spinner to form a uniform thin film 5800 Å thick. Then, using an electron beam exposure system at an accelerating voltage of 20 kV there were drawn 512 parallel lines at equal spacings in an area of 0.95 mm $\times$ 0.95 mm, with a single line consisting of 1024 spots. The beam current was 0.6 nA and the exposure time for each individual spot was 240 $\mu$sec. The wafer after exposure was subjected to development with acetone to give a good parallel-line pattern. The line spacing was about 1.86$\mu$.

EXAMPLE 11

To 1.01 g. of polyvinyl alcohol (weight average molecular weight 138,000) was added 10 ml of pyridine followed by heating overnight at 95°–100° C. Further, 20 ml of pyridine was added and 6.25 g. of p-(dimethylvinylsilyl)benzoyl chloride was introduced at 62° C., and stirring was continued for 4 hours at 60° C. The reaction mixture was diluted with 30 ml of acetone and, after separation of solids through a glass filter, the polymer solution was poured into about 1.5 l of water to allow polymer to precipitate. After standing overnight, the polymer was separated, washed with methanol and dried under reduced pressure to yield 2.90 g. of a white polymer. The silicon content of the polymer was analyzed to be 11.7%, with the content of vinyl groups being $4.17 \times 10^{-3}$ equivalent/g, and the reduced viscosity $\eta sp/C$ as 1.58.

Using cellosolve acetate as solvent, a thin film of the polymer was formed on a masking chromium substrate (chromium film thickness about 700 Å) by means of a spinner. The film thus formed was uniform with a film thickness of 5500 Å, on which were then drawn parallel lines with an electron geam at an accelerating voltage of 20 kV and a beam current of 0.5 nA in the same manner as in Example 10. There was obtained a parallel-line pattern of high accuracy with a line width of about 0.9μ and a line spacing of 3.71μ. The pattern was treated with an etching solution of metallic chromium, then the polymer film was swollen with acetone and rubbed off to give a chromium mask of parallel lines. The pattern accuracy was fully satisfactory.

To a 30 kV electron beam this radiation sensitive material proved to have the following sensitivity characteristics.

$Q_{0.5} = 1.0 \times 10^{-7}$ coulomb/cm$^2$
$\gamma_{0.5} = 1.02$

EXAMPLE 12

1.7 g. of polyepichlorohydrin ($\eta sp/C=3.26$) was dissolved in 20 ml of hexamethylphosphorictriamide, and 4.4 g. of potassium p-(dimethylvinylsilyl)benzoate and 0.18 g. of ethyltrimethyl ammonium iodide were added, followed by heating for 10 hours at 100° C. After standing to cool, the reaction mixture was poured into 500 ml of water and solids were filtered off, washed with methanol, again dissolved in 50 ml of chlorobenzene followed by filtration under reduced pressure. The filtrate was poured into methanol and a solid polymer was filtered off and dried under reduced pressure. Yield 3.77 g. The silicon content of the polymer was analyzed to be 9.9% and the content of vinyl groups was $3.52 \times 10^{-3}$ equivalent/g.

A solution of the polymer in ethyl cellosolve acetate was applied onto a masking substrate of chromium oxide to form a uniform thin film 5800 Å thick. Then the substrate was charged in an electron beam exposure system (JBX-4S manufactured by Nippon Denshi Co.), and in a square area with one side 0.95 mm there were drawn 256 and 512 parallel lines using an electron beam at an accelerating voltage of 20 kV and a beam current of 0.5 nA. The beam scanning rate was 6 msec/0.95 mm. Subsequent development in known manner afforded parallel-line patterns of high accuracy with a line width of 1.0μ.

EXAMPLE 13

2.1 g. of cellulose acetate ($\eta sp/C=2.41$), 9.6 g. of 7-(dimethylvinylsilyl)heptanoyl chloride and 20 ml of dioxane were mixed together, and 10 ml of pyridine was added dropwise over a period of 15 minutes while the said mixture was stirred at room temperature. After completion of the dropping, stirring was continued for 5 hours at 97° C. The reaction mixture, after allowed to cool, was poured into 1.5 l of methanol and the precipitated fibrous polymer was filtered off. After drying under reduced pressure, 2.8 g. of polymer was obtained as a light brown solid. The silicon content of the polymer was analyzed to be 5.0%, which value corresponds to the reaction of 0.52 silicon-containing acid chloride per glucose unit.

Main absorptions in infrared spectrum were as follows. (unit: cm$^{-1}$): 700, 780, 840, 900, 945, 1040, 1220, 1360, 1590, 1750, 2920.

The sensitivity characteristics to electron beam were as follows.

$Q_{0.5} = 1.0 \times 10^{-7}$ coulomb/cm$^2$
$\gamma_{0.5} = 0.70$

EXAMPLE 14

In the same manner as in Example 13 there was prepared a silicon-containing polymer by the reaction of cellulose acetate and 4-(methyldivinyl)butyryl chloride. The silicon content of the polymer was analyzed to be 5.1%, which value corresponds to the reaction of 0.53 silicon-containing acid chloride per glucose unit of cellulose.

Main absorptions in infrared spectrum of the polymer were as follows. (unit: cm$^{-1}$): 740, 785, 890, 940, 1040, 1110, 1150, 1210, 1360, 1400, 1580, 1750, 2950.

The polymer proved to have the following sensitivity characteristics, $Q_{0.5} = 2.1 \times 10^{-7}$ coulomb/cm$^2$
$\gamma_{0.5} = 0.79$

EXAMPLE 15

In the same manner as in Example 13 there was prepared a silicon-containing polymer from cellulose acetate and 5-(dimethylvinylsilyl)valeryl chloride. The silicon content of the polymer was analyzed to be 5.0%, which value corresponds to the reaction of an average of 0.56 silicon-containing acid chloride per glucose unit of cellulose.

Main absorptions in infrared spectrum of the polymer were as follows. (unit: cm$^{-1}$): 700, 770, 830, 940, 1040, 1120, 1150, 1220, 1360, 1590, 1750, 2950.

The sensitivity characteristics to electron beam were as follows.

$Q_{0.5} = 3.3 \times 10^{-7}$ coulomb/cm$^2$
$\gamma_{0.5} = 0.61$

EXAMPLE 16

In the same manner as in Example 13 there was prepared a silicon-containing polymer by the reaction of cellulose acetate and p-(dimethylvinylsilyl)benzoyl chloride. The silicon content of the polymer was analyzed to be 3.9%, which value corresponds to the introduction of 0.38 silicon-containing structure per glucose unit of cellulose.

Main absorptions in infrared spectrum were as follows. (unit: cm$^{-1}$): 700, 720, 760, 780, 815, 830, 895, 1040, 1220, 1365, 1595, 1750, 2950.

The polymer proved to have the following sensitivity characteristics.

$Q_{0.5} = 4.8 \times 10^{-7}$ coulomb/cm$^2$
$\gamma_{0.5} = 0.70$

EXAMPLE 17

In the same manner as in Example 13 there was prepared a silicon-containing polymer by the reaction of amylose and p-(dimethylvinylsilyl)benzoyl chloride. The silicon content of the polymer was analyzed to be 10.15%, which value corresponds to the reaction of 1.8 silicon-containing benzoyl chlorides per glucose unit of amylose.

Main absorptions in infrared spectrum were as follows. (unit: cm$^{-1}$): 690, 710, 750, 770, 810, 830, 940, 1010, 1080, 1180, 1265, 1380, 1590, 1720, 2925, 3450.

The polymer proved to have the following sensitivity characteristics.

$Q_{0.5} = 1.5 \times 10^{-7}$ coulomb/cm$^2$
$\gamma_{0.5} = 0.82$

EXAMPLE 18

In the same manner as in Example 13 there was prepared a silicon-containing polymer from, in place of cellulose acetate, benzylamino cellulose and 5-(dimethylvinylsilyl)valeryl chloride. The silicon content of the polymer was 11.7%.

The polymer proved to have the following sensitivity characteristics.

$Q_{0.5} = 8.0 \times 10^{-7}$ coulomb/cm$^2$
$\gamma 0.5 = 1.03$

EXAMPLE 19

In the same manner as in Example 12 there was prepared a silicon-containing polymer from polyepichlorohydrin and potassium 5-(dimethylvinylsilyl)valerate. The silicon content of the polymer was analyzed to be 11.1%, which value corresponds to the reaction of 90% of the structural units of polyepichlorohydrin with potassium 5-(dimethylvinylsilyl)valerate.

The polymer proved to have the following sensitivity characteristics.

$Q_{0.5} = 5.7 \times 10^{-8}$ coulomb/cm$^2$
$\gamma_{0.5} = 0.90$

EXAMPLE 20

In the same manner as in Example 12 there was carried out a reaction of poly-2-chloroethyl vinyl ether ($\eta$sp/C=1.15) and potassium 4-(methyldivinylsilyl)butyrate. The silicon content of the resulting polymer was analyzed to be 10.5%, which value corresponds to the reaction of 88% of the structural units of the starting polymer with potassium 4-(methyldivinylsilyl)butyrate.

Main absorptions in infrared spectrum were as follows. (unit: cm$^{-1}$): 745, 790, 880, 940, 1000, 1110, 1160, 1190, 1245, 1280, 1340, 1380, 1400, 1590, 1740, 2950, 3050.

The polymer proved to have the following sensitivity characteristics.

$Q_{0.5} = 1.01 \times 10^{-7}$ coulomb/cm$^2$
$\gamma_{0.5} = 0.71$

EXAMPLE 21

0.70 g. of poly(N-acryloylbenztriazole) ($\eta$sp/C=1.01) was dissolved in 7 ml of dichloromethane, and into the resulting solution was dropwise added a solution of 0.84 ml triethylamine and 1.1 g. 3-(methyldivinylsilyl)propylamine in 2 ml of dichloromethane was stirring at room temperature over a period of 5 minutes. After completion of the dropping, the resulting solution was allowed to stand for 16 hours at room temperature and then poured into 400 ml of methanol. The resulting polymer was isolated and dried under reduced pressure. Yield 0.75 g.

The polymer was subjected to elementary analysis to give the following results.

|  | C (%) | H (%) | N (%) | S (%) |
|---|---|---|---|---|
| Found | 62.92 | 9.20 | 7.41 | 13.4 |
| Calculated | 63.10 | 9.15 | 7.64 | 13.49 |
| (C$_{11}$H$_{19}$ONSi) | | | | |

The above calculated values were obtained on the basis of the following reaction formula.

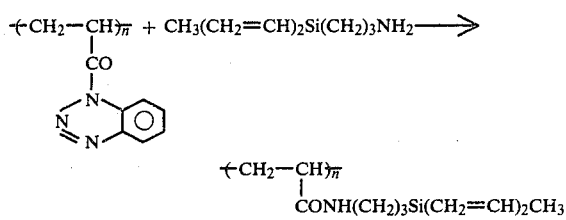

Main absorptions in infrared spectrum were as follows. (unit: cm$^{-1}$): 690, 745, 800, 865, 950, 1010, 1050, 1180, 1250, 1400, 1440, 1540, 1590, 1650, 2490, 3010, 3050, 3300.

The polymer proved to have the following sensitivity characteristics.

$Q_{0.5} = 3.2 \times 10^{-8}$ coulomb/cm$^2$
$\gamma_{0.5} = 0.82$

EXAMPLE 22

In the same manner as in Example 21 there was prepared a silicon-containing polymer from poly(N-acryloylbenztriazole) ($\eta$sp/C=0.74) and 5-(dimethylvinylsilyl)pentylamine.

The polymer was subjected to elementary analysis to give the following results.

|  | C (%) | H (%) | N (%) | Si (%) |
|---|---|---|---|---|
| Found | 63.69 | 10.33 | 6.24 | 12.6 |
| Calculated | 63.94 | 10.29 | 6.21 | 12.46 |
| (C$_{12}$H$_{23}$ONSi) | | | | |

Main absorptions in infrared spectrum were as follows. (unit: cm$^{-1}$): 700, 775, 835, 950, 1010, 1180, 1240, 1400, 1540, 1640, 2910, 3050, 3300.

The polymer proved to have the following sensitivity characteristics.

$Q_{0.5} = 7.4 \times 10^{-8}$ coulomb/cm$^2$
$\gamma_{0.5} = 0.74$

EXAMPLE 23

In the same manner as in Example 21 there was prepared a silicon-containing polymer from poly(N-acryloylbenztriazole) ($\eta$sp/C=1.24) and p-(dimethylvinylsilyl)benzylamine.

The polymer was subjected to elementary analysis to give the following results.

|  | C (%) | H (%) | N (%) | Si (%) |
|---|---|---|---|---|
| Found | 68.21 | 8.00 | 5.43 | 11.4 |
| Calculated | 68.52 | 7.81 | 5.71 | 11.44 |
| (C$_{14}$H$_{19}$ONSi) | | | | |

The sensitivity characteristics to electron beam were as follows.

$Q_{0.5} = 3.15 \times 10^{-7}$ coulomb/cm$^2$ $\gamma_{0.5} = 0.82$

EXAMPLE 24

In the same manner as in Example 21 there was carried out a reaction of poly(N-acryloylbenztriazole)($\eta sp/C = 1.70$) and 3-(dimethylvinylsilyl)-3-phenylpropylamine to prepare a silicon-containing polymer.

The following are the results of elementary analysis of the polymer.

|  | C (%) | H (%) | N (%) | Si (%) |
|---|---|---|---|---|
| Found | 69.87 | 8.58 | 5.48 | 9.82 |
| Calculated ($C_{16}H_{23}ONSi$) | 70.28 | 8.48 | 5.12 | 10.26 |

Main absorptions in infrared spectrum were as follows. (unit: $cm^{-1}$): 700, 780, 830, 900, 950, 1000, 1030, 1090, 1140, 1210, 1240, 1400, 1450, 1490, 1530, 1600, 1650, 2950, 3020, 3050, 3300.

The polymer proved to have the following sensitivity characteristics.

$Q_{0.5} = 5.2 \times 10^{-8}$ coulomb/cm$^2$
$\gamma_{0.5} = 0.91$

EXAMPLE 25

494 mg of the ethyl vinyl ether-maleic anhydride alternating copolymer ($\eta sp/C = 1.01$) obtained by fractionation in Example 10 was dissolved in 10 ml of acetonitrile, and 450 mg of 3-(methyldivinylsilyl)-propylamine dissolved in 3 ml of acetonitrile was added. The mixture was shaken up for 3 hours at room temperature then allowed to stand overnight at room temperature and acetonitrile was distilled off at room temperature and under reduced pressure. The residual polymer was dissolved in 15 ml of n-butanol and was checked for sensitivity characteristics, the results of which were as follows.

$Q_{0.5} = 7.3 \times 10^{-8}$ coulomb/cm$^2$
$\gamma_{0.5} = 1.00$

Main absorptions in infrared spectrum were as follows. (unit: $cm^{-1}$): 680, 745, 800, 950, 1050, 1090, 1180, 1250, 1400, 1570, 1720, 2950, 3050, 3250.

EXAMPLE 26

The same ethyl vinyl ether-maleic anhydride alternating copolymer as that used in Example 25 was reacted with p-(dimethylvinylsilyl)benzylamine to prepare a silicon-containing polymer.

The polymer proved to have the following sensitivity characteristics.

$Q_{0.5} = 1.9 \times 10^{-7}$ coulomb/cm$^2$
$\gamma_{0.5} = 1.26$

Main absorptions in infrared spectrum were as follows. (unit: $cm^{-1}$): 700, 780, 820, 840, 950, 1010, 1110, 1250, 1400, 1600, 1650, 1720, 2950, 3050, 3270.

EXAMPLE 27

The same ethyl vinyl ester-maleic anhydride alternating copolymer as that used in Example 25 was reacted with 5-(dimethylvinylsilyl)pentylamine to give a silicon-containing polymer, and a n-butanol solution of the polymer was prepared in the same way as in Example 25.

The sensitivity characteristics were as follows.
$Q_{0.5} = 1.1 \times 10^{-7}$ coulomb/cm$^2$
$\gamma_{0.5} = 0.98$ Main absorptions in infrared spectrum were as follows. (unit: $cm^{-1}$): 710, 780, 840, 950, 1010, 1090, 1250, 1405, 1570, 1640, 1720, 2930, 3050, 3250.

EXAMPLE 28

20.0 g. of ethyl vinyl ether-maleic anhydride alternating copolymer ($\eta sp/C = 1.53$) was dissolved in 800 ml of acetone, and a fractional precipitation was made into six fractions by the use of 370 ml n-hexane and 1680 ml benzene.

Then, using the fourth fraction (the portion of 42–60% by weight, $\eta sp/C = 1.34$), a synthesis was performed; that is, ethyl vinyl ester-maleic anhydride alternating copolymer and p-(dimethylvinylsilyl)benzylamine were reacted together in the same way as in Example 25 to prepare a silicon-containing polymer.

the sensitivity characteristics were as follows.
$Q_{0.5} = 9.9 \times 10^{-8}$ coulomb/cm$^2$
$\gamma_{0.5} = 1.26$

EXAMPLE 29

30 g. of ethyl vinyl ether-maleic anhydride copolymer ($\eta sp/C = 2.56$) was dissolved in 600 ml of acetone, and a molecular weight fractionation was made using 1830 ml (in total) of toluene.

The 34% to 59% portion by weight was isolated, with $\eta sp/C = 2.35$. Then in the same way as in Example 25 this fraction was reacted with p-(dimethylvinylsilyl)-benzylamine to give a silicon-containing polymer and a n-butanol solution of the polymer was prepared.

The sensitivity charcteristics were as follows.
$Q_{0.5} = 6.5 \times 10^{-8}$ coulomb/cm$^2$
$\gamma_{0.5} = 1.01$

EXAMPLE 30

In the same way as in Example 25 there was prepared a n-butanol solution of a silicon-containing polymer from n-butyl vinyl ether-maleic anhydride copolymer (intrinsic viscosity of 1.46 measured in MEK at 25° C.) and 5-(dimethylvinylsilyl)pentamine.

The sensitivity characteristics were determined as follows.
$Q_{0.5} = 1.25 \times 10^{-7}$ coulomb/cm$^2$
$\gamma_{0.5} = 0.79$

EXAMPLE 31

508 mg of styrene-maleic anhydride alternating copolymer ($\eta sp/C = 2.25$) was dissolved in 10 ml of acetone, and 394 mg of 3-(methyldivinylsilyl)propylamine dissolved in 10 ml of acetone ws added dropwise. The reaction mixture was allowed to stand overnight at room temperature and then acetone was distilled off under reduced pressure to give a silicon-containing polymer. The polymer was dissolved in n-butanol to prepare a stock solution for determination of its sensitivity characteristics.

The sensitivity characteristics were as follows.
$Q_{0.5} = 8.8 \times 10^{-8}$ coulomb/cm$^2$
$\gamma_{0.5} = 0.84$

EXAMPLE 32

500 mg. of styrene-maleic anhydride alternating copolymer ($\eta sp/C = 2.79$) was dissolved in 5 ml of methyl ethyl ketone, and 420 mg of 3-(methyldivinylsilyl)-propylamine was added in a dissolved state in 5 ml methyl ethyl ketone. After standing overnight, methyl ethyl ketone was distilled off under reduced pressure leaving a solid, silicon-containing polymer.

The polymer proved to have the following sensitivity charcteristics.
$Q_{0.5} = 1.28 \times 10^{-7}$ coulomb/cm$^2$
$\gamma_{0.5} = 1.08$

EXAMPLE 33

361 mg of the same styrene-maleic anhydride alternating copolymer as that used in Example 32, 615 mg of p-(dimethylvinylsilyl)benzylamine benzoate and 12 ml of dimethylformamide were mixed together and shaken up for 3 hours at room temperature, then allowed to stand overnight.

The reaction mixture was poured into a mixture of 140 ml 1N hydrochloric acid and 140 ml methanol followed by stirring. The resulting polymer was filtered off, washed with a (1:1) mixture of water and methanol and then dried under reduced pressure.

The following are the results of elementary analysis of the polymer.

|  | C (%) | H (%) | N (%) | Si (%) |
|---|---|---|---|---|
| Found | 69.02 | 6.67 | 3.15 | 6.82 |
| Calculated (C$_{23}$H$_{27}$O$_3$NSi) | 70.19 | 6.92 | 3.56 | 7.14 |

The sensitivity characteristics were determined as follows.
$Q_{0.5} = 2.23 \times 10^{-7}$ coulomb/cm$^2$
$\gamma_{0.5} = 1.09$

EXAMPLE 34

1.0 g. n-butyl vinyl ether-maleic anhydride alternating copolymer (intrinsic viscosity of 1.46 determined in methyl ethyl ketone at 25° C.) was dissolved in 15 ml dimethylformamide, and 1.88 g. of 3-(methyldivinylsilyl)propylamine was added in a dissolved state in 5 ml of dimethylformamide. After stirring for 2 hours at room temperature, 1.68 ml of triethylamine and 10.5 g. of a 17.4% solution of 1-methyl-2-chloropyridinium tosylate in dimethylformamide were added. After standing overnight at room temperature, the reaction mixture was poured into 1.5 l of water followed by stirring overnight at room temperature, then a solid polymer was obtained by filtration. Yield 2.34 g.

The following are the results of elementary analysis of the polymer.

|  | C (%) | H (%) | N (%) | Si (%) |
|---|---|---|---|---|
| Found | 63.49 | 9.20 | 5.98 | 10.95 |
| Calculated (C$_{26}$H$_{46}$O$_3$N$_2$Si) | 63.62 | 9.45 | 5.71 | 11.44 |

The sensitivity characteristics were determined as follows.
$Q_{0.5} = 1.56 \times 10^{-7}$ coulomb/cm$^2$
$\gamma_{0.5} = 0.87$
Main absorptions in infrared spectrum were as follows. (unit: cm$^{-1}$): 685, 705, 740, 800, 950, 1010, 1090, 1180, 1250, 1405, 1460, 1590, 1650, 2950, 3050, 3350.

EXAMPLE 35

20 g. of ethyl vinyl ether-maleic anhydride alternating copolymer was dissolved in 800 ml of acetone, and a molecular weight fractionation was made using 455 ml n-hexane and 1660 ml (in total) benzene.

As the fourth fraction, the 48–66% fraction by weight ($\eta$sp/C=1.00) was withdrawn and used in the following reaction.

That is, 303 mg of the above polymer, 626 mg of p-(dimethylvinylsilyl)benzylamine benzoate and 10 ml of diemthylformamide were mixed together and stirred for 2 hours at room temperature. Then after standing overnight at room temperature, the reaction mixture was poured into a mixture of 140 ml 1N hydrochloric acid and 150 ml methanol followed by stirring for 1 hours, then the resulting polymer was filtered off, washed in a (1:1) mixture of water and methanol and dried under reduced pressure.

The following are the results of elementary analysis of the polymer.

|  | C (%) | H (%) | N (%) | Si (%) |
|---|---|---|---|---|
| Found | 62.84 | 7.47 | 4.01 | 7.5 |
| Calculated (C$_{19}$H$_{27}$O$_4$NSi) | 63.12 | 7.53 | 3.88 | 7.77 |

The sensitivity characteristics were as follows.
$Q_{0.5} = 1.73 \times 10^{-7}$ coulomb/cm$^2$
$\gamma_{0.5} = 1.29$

EXAMPLE 36

From ethylene-maleic anhydride alternating copolymer ($\eta$sp/C=1.26) and 3-(methyldivinylsilyl)propylamine there was prepared a silicon-containing polymer in the same way as in Example 34.

The polymer proved to have the following sensitivity characteristics.
$Q_{0.5} = 4.5 \times 10^{-8}$ coulomb/cm$^2$
$\gamma_{0.5} = 0.68$
Main absorptions in infrared spectrum were as follows. (unit: cm$^{-1}$): 645, 690, 800, 950, 1010, 1050, 1180, 1250, 1310, 1400, 1440, 1560, 1640, 2950, 3050, 3250.

EXAMPLE 37

5.84 g. of isobutyl vinyl ether-maleic anhydride alternating copolymer ($\eta$sp/C=1.05) was dissolved in 46 ml DMF (dimethylformamide), and 5.70 g. of 4-(dimethylvinylsilyl)benzylamine was dropwise added with stirring at room temperature over a period of 30 minutes. Stirring was continued for further 24 hours, and a polymer solution was obtained by adding 126 ml of n-butanol.

The polymer solution was applied onto NESA plate and the sensitivity characteristics were determined as followed.
$Q_{0.5} = 1.6 \times 10^{-7}$ coulomb/cm$^2$
$\gamma_{0.5} = 0.89$
Also, the polymer solution was applied onto a NaCl plate, dried under reduced pressure and then checked for main absorptions in infrared spectrum, which were as follows. (unit: cm$^{-1}$): 700, 770, 820, 950, 1000, 1100, 1240, 1400, 1460, 1600, 1650, 1720, 2950, 3300.

EXAMPLE 38

3.96 g. of methyl vinyl ether-maleic anhydride alternating copolymer (Gantrez AN 119) was dissolved in 27 ml DMF, and 4.86 g. of 4-(dimethylvinylsilyl)benzylamine was dropwise added with stirring at room temperature over a period of 30 minutes. Stirring was continued for further 2 hours and then the reaction mixture was allowed to stand for 15 hours, thereafter a polymer solution was prepared by adding 105 ml of n-butanol.

The polymer solution was applied onto NESA plate and its sensitivity characteristics were determined as follows.

$Q_{0.5} = 3.3 \times 10^{-7}$ coulomb/cm$^2$
$\gamma_{0.5} = 0.81$

Also, the polymer solution was applied onto a NaCl plate, dried under reduced pressure and then checked for main absorptions in infrared spectrum, which were as follows. (unit: cm$^{-1}$): 700, 780, 820, 950, 1010, 1110, 1240, 1400, 1600, 1650, 1720, 2950, 3300.

EXAMPLE 39

6.87 g. of isobutene-maleic anhydride copolymer (Isoban 04, a product of Kuraray Co.) was dissolved in 46.2 ml DMF, and 9.48 g. of 4-(dimethylvinylsilyl)benzylamine was dropwise added with stirring at room temperature over a period of 30 minutes. Stirring was continued for further 2 hours and then the reaction mixture was allowed to stand for 15 hours, thereafter a polymer solution was prepared by adding 117 ml of n-butanol.

The polymer solution was applied onto NESA plate and its sensitivity characteristics were determined as follows.

$Q_{0.5} = 5.1 \times 10^{-7}$ coulomb/cm$^2$
$\gamma_{0.5} = 0.89$

Also, the polymer solution was applied onto a NaCl plate, dried under reduced pressure and then checked for main absorptions in infrared spectrum, which were as follows. (unit: cm$^{-1}$): 700, 770, 820, 950, 1000, 1005, 1240, 1395, 1580, 1660, 1710, 2950, 3250.

EXAMPLE 40

1.93 g. of ethyl vinyl ether - maleic anhydride alternating copolymer ($\eta$sp/C=2.53), 2.64 g. of 4-(dimethylvinylsilyl)benzyl alcohol and 1.41 g. of triethylamine were dissolved in 40 ml of acetonitrile followed by stirring for 2 hours. Then after standing for 15 hours at room temperature, 15 ml of a concentrated hydrochloric acid was added and then the reaction mixture was poured into 400 ml of water containing 20 ml of a concentrated hydrochloric acid, followed by stirring for 1 hour, then was crushed in water by a mixer and filtered. Drying under reduced pressure afforded 3.97 g. of a powdered colorless polymer. The silicon content of the polymer was analyzed to be 8.0%.

The polymer proved to have the following sensitivity characteristics.

$Q_{0.5} = 3.7 \times 10^{-7}$ coulomb/cm$^2$
$\gamma_{0.5} = 1.15$

Main absorptions in infrared spectrum were as follows. (unit: cm$^{-1}$): 700, 780, 820, 950, 1010, 1110, 1165, 1245, 1400, 1740, 2950.

EXAMPLE 41

30.2 g. of styrene-maleic anhydride alternating copolymer ($\eta$sp/C=3.01) was dissolved in 955 g. of acetone, and a fractionation was made using a total of 182 g. n-hexane to give a 32.4–68.6% fraction by weight ($\eta$sp/C=2.88). 4.48 g. of the fraction was dissolved in 79 ml DMF, and a mixture of 2.36 g. 4-(dimethylvinylsilyl)benzylamine and 1.06 g. benzylamine was dropwise added with stirring at room temperature for a period of 30 minutes. Stirring was continued for further 2 hours and then the reaction mixture was allowed to stand for 15 hours, thereafter a polymer solution was prepared by adding 118 ml of n-butanol.

The polymer solution was applied onto NESA plate and its sensitivity characteristics were determined as follows.

$Q_{0.5} = 1.39 \times 10^{-7}$ coulomb/cm$^2$
$\gamma_{0.5} = 1.26$

Also, the polymer solution was applied onto a NaCl plate, dried under reduced pressure and then checked for main absorptions in infrared spectrum, which were as follows. (unit: cm$^{-1}$): 705, 780, 825, 955, 1010, 1110, 1250, 1400, 1455, 1500, 1600, 1660, 1725, 2950, 3040, 3260.

EXAMPLE 42

Using 2.77 g. of the same fractionated styrene-maleic anhydride alternating copolymer as that obtained in Example 41, 2.58 g. of 4-(dimethylvinylsilyl)benzylamine, 53.4 ml of DMF and 80.1 ml of n-butanol, a polymer solution was prepared in the same way as in Example 41.

The sensitivity characteristics were as follows.

$Q_{0.5} = 8 \times 10^{-8}$ coubomb/cm$^2$
$\gamma_{0.5} = 0.98$

Main absorptions in infrared spectrum were as follows. (unit: cm$^{-1}$): 700, 780, 825, 950, 1010, 1110, 1250, 1400, 1450, 1500, 1600, 1730, 2950, 3030, 3260.

EXAMPLE 43

Using 346 mg of the same fractionated styrene-maleic anhydride alternating copolymer as that obtained in Example 41, 263 mg of 4-(dimethylvinylsilyl)benzylamine, 36 mg of benzylamine, 6.45 ml of DMF and 9.68 ml of n-butanol, a polymer solution was prepared in the same way as in Example 41.

The sensitivity characteristics were as follows.

$Q_{0.5} = 1.3 \times 10^{-7}$ coulomb/cm$^2$
$\gamma_{0.5} = 0.99$

Main absorptions in infrared spectrum were as follows. (unit: cm$^{-1}$): 700, 780, 820, 955, 1010, 1110, 1245, 1400, 1455, 1500, 1600, 1660, 1730, 2950, 3030, 3250.

EXAMPLE 44

50.2 g. of styrene-maleic anhydride alternating copolymer ($\eta$sp/C=1.74) was dissolved in 83.4 ml of DMF, and a mixture of 2.14 g. 3-methyldivinylsilyl propylamine and 1.18 g. benzylamine was dropwise added with stirring at room temperature over a period of 30 minutes. Stirring was continued for further 2 hours and then the reaction mixture was allowed to stand for 15 hours at room temperature, thereafter a polymer solution was prepared by adding 83.4 ml of n-butanol.

The polymer solution was applied onto NESA plate and its sensitivity characteristics were determined as follows.

$Q_{0.5} = 1.36 \times 10^{-7}$ coulomb/cm$^2$
$\gamma_{0.5} = 0.89$

Also, the polymer solution was applied onto a NaCl plate, dried under reduced pressure and then checked for main absorptions in infrared spectrum, which were as follows: (unit: cm$^{-1}$): 700, 750, 800, 950, 1010, 1250, 1400, 1455, 1500, 1600, 1720, 2950, 3040, 3270.

EXAMPLE 45

Using 492 mg of the same styrene-maleic anhydride alternating copolymer as that used in Example 44, 363 mg of 3-methyldivinylsilyl propylamine, 8.35 ml of DMF and 8.5 ml of n-butanol, a polymer solution was prepared in the same way as in Example 44.

The sensitivity characteristics were as follows.

$Q_{0.5} = 5.0 \times 10^{-8}$ coulomb/cm$^2$ $\gamma_{0.5} = 0.74$

Main absorptions in infrared spectrum were as follows. (unit: cm$^{-1}$): 700, 750, 800, 950, 1010, 1180, 1250, 1400, 1450, 1500, 1595, 1720, 2950, 3050, 3260.

EXAMPLE 46

Using 5.07 g. of the same styrene-maleic anhydride alternating copolymer as that used in Example 44, 1.53 g. of 3-methyldivinylsilyl propylamine, 1.63 g. of benzylamine, 82.3 ml of DMF and 82.3 ml of n-butanol, a polymer solution was prepared in the same way as in Example 44.

The sensitivity characteristics were as follows:

$Q_{0.5} = 1.79 \times 10^{-7}$ coulomb/cm$^2$ $\gamma_{0.5} = 0.96$

Main absorptions in infrared spectrum were as follows. (unit: cm$^{-1}$): 700, 750, 800, 950, 1010, 1110, 1180, 1250, 1390, 1405, 1455, 1500, 1600, 1725, 2950, 3050, 3250.

EXAMPLE 47

495 mg of styrene-maleic anhydride alternating copolymer ($\eta$sp/C=1.74) was dissolved in 20 ml of THF, and 157 mg (0.336 mole equivalent) of 4-(dimethylvinylsilyl)benzylamine was dripwise added over a period of 20 minutes in a dissolved state in 12 ml THF. After standing for 15 hours at room temperature, a mixture of 5 ml water and 2 ml triethylamine was added followed by further standing for 15 hours at room temperature. Then 3 ml of a concentrated hydrochloric acid was added, THF was distilled off under reduced pressure and the residue was poured into 200 ml of a water-methanol mixture (1:1 volume ratio) containing 5 ml of a concentrated hydrochloric acid. After stirring for 1 hour, the solvent was decanted off and the resulting polymer was crushed in water by a mixer. Then after filtration under reduced pressure, drying was applied at room temperature and under reduced pressure to yield 550 mg of a powdered colorless polymer. The silicon content of the polymer was analyzed to be 3.35%.

The polymer proved to have the following sensitivity characteristics.

$Q_{0.5} = 3.70 \times 10^{-7}$ coulomb/cm$^2$ $\gamma_{0.5} = 1.01$

Main absorptions in infrared spectrum were as follows. (unit: cm$^{-1}$): 700, 775, 820, 950, 1005, 1105, 1250, 1395, 1450, 1600, 1725, 2950, 3500.

EXAMPLE 48

Using 495 mg of the same styrene-maleic anhydride alternating copolymer as that used in Example 47 and 319 mg (0.682 mole equivalent) of 4-(dimethylvinylsilyl)benzylamine, there was prepared a polymer by the same reaction as that conducted in Example 47. The silicon content of the polymer was analyzed to be 5.6%.

The polymer proved to have the following sensitivity characteristics.

$Q_{0.5} = 2.7 \times 10^{-7}$ coulomb/cm$^2$ $\gamma_{0.5} = 1.06$

Main absorptions in infrared spectrum were as follows. (unit: cm$^{-1}$): 700, 680, 820, 950, 1005, 1110, 1250, 1400, 1450, 1600, 1725, 2950, 3430.

EXAMPLE 49

Using 495 mg of the same styrene-maleic anhydride alternating copolymer as that used in Example 47 and 374 mg (0.800 mole equivalent) of 4-(dimethylvinylsilyl)benzylamine, there was prepared a polymer by the same reaction as that conducted in Example 47. The silicon content of the polymer was analyzed to be 5.8%.

The polymer proved to have the following sensitivity characteristics.

$Q_{0.5} = 2.04 \times 10^{-7}$ coulomb/cm$^2$ $\gamma_{0.5} = 1.00$

Main absorptions in infrared spectrum were as follows. (unit: cm$^{-1}$): 700, 775, 820, 950, 1005, 1110, 1240, 1400, 1450, 1495, 1600, 1720, 2950, 3025, 3260.

EXAMPLE 50

Using 495 mg of the same styrene-maleic anhydride alternating copolymer as that used in Example 47 and 468 mg (1.00 mole equivalent) of 4-(dimethylvinylsilyl)benzylamine, there was prepared a polymer by the same reaction as that conducted in Example 47. The silicon content of the polymer was analyzed to be 6.9%.

The polymer proved to have the following sensitivity characteristics.

$Q_{0.5} = 1.42 \times 10^{-7}$ coulomb/cm$^2$ $\gamma_{0.5} = 0.92$

Main absorptions in infrared spectrum were as follows. (unit: cm$^{-1}$): 700, 780, 825, 950, 1010, 1110, 1250, 1400, 1450, 1500, 1600, 1730, 2950, 3030, 3260.

EXAMPLE 51

6.30 g. of ethyl vinyl ether - maleic anhydride copolymer (36:64 mole ratio) ($\eta$sp/C=0.30) was dissolved in 42 ml of DMF, and 7.74 g. of 4-(dimethylvinylsilyl)benzylamine was dropwise added with stirring at room temperature over a period of 30 minutes. After stirring for 2 hours, the reaction mixture was allowed to stand for 15 hours at room temperature and then 140 ml of n-butanol was added to prepare a polymer solution.

The polymer solution was applied onto NESA plate and its sensitivity characteristics were determined as follows.

$Q_{0.5} = 6.0 \times 10^{-7}$ coulomb/cm$^2$ $\gamma_{0.5} = 0.96$

Also, the polymer solution was applied onto a NaCl plate, dried under reduced pressure and then checked for main absorptions in infrared spectrum, which were as follows: (unit: cm$^{-1}$): 700, 680, 820, 955, 1010, 1110, 1240, 1400, 1600, 1650, 1720, 2950, 3280.

EXAMPLE 52

8.78 g. of styrene-maleic anhydride copolymer (46:54 mole ratio) ($\eta$sp/C=0.78) was dissolved in 68.4 ml of DMF, and 9.20 g. of 4-(dimethylvinylsilyl)benzylamine was dropwise added with stirring at room temperature over a period of 30 minutes. After stirring for 2 hours, the reaction mixture was allowed to stand for 15 hours at room temperature and then 164 ml of n-butanol was added to prepare a polymer solution.

The polymer solution was applied onto NESA plate and its sensitivity characteristics were determined as follows.

$Q_{0.5} = 3.1 \times 10^{-7}$ coulomb/cm$^2$ $\gamma_{0.5} = 0.89$

Also, the polymer solution was applied onto a NaCl plate, dried under reduced pressure and then checked for main absorptions in infrared spectrum, which were as follows. (unit: cm$^{-1}$): 700, 775, 820, 950, 1005, 1105, 1240, 1390, 1600, 1650, 1720, 2950, 3020, 3250.

EXAMPLE 53

505 mg of polyvinyl alcohol (Gohsenol GL-05, a product of the Nippon Synthetic Chemical Industry Co., with a saponification degree of 86.5 to 89.0 mole %) was suspended in 15 ml of pyridine, and 2.75 g. of 4-(dimethylvinylsilyl)benzoyl chloride was dropwise added with stirring at room temperature over a period of 20 minutes. After stirring for 24 hours at room temperature, 30 ml of acetone was added followed by filtration under reduced pressure, then acetone was distilled out of the mother liquor under reduced pressure and the residue was poured into 300 ml of an aqueous 1 N sodium hydroxide solution. Then after stirring for 1 hour, a mass of polymer was taken out, crushed in water by a mixer and filtered under reduced pressure. Washing with methanol and drying under reduced pressure yielded 1.50 g. of powdered colorless polymer. The silicon content of the polymer was analyzed to be 10.8%.

The polymer proved to have the following sensitivity characteristics.

$Q_{0.5} = 1.27 \times 10^{-6}$ coulomb/cm$^2$
$\gamma_{0.5} = 0.91$

Main absorptions in infrared spectrum were as follows. (unit: cm$^{-1}$): 700, 720, 760, 780, 820, 950, 1010, 1020, 1090, 1120, 1190, 1250, 1390, 1500, 1555, 1600, 1720, 2950, 3050.

EXAMPLE 54

Using 508 mg of the same polyvinyl alcohol as that used in Example 53, 2.20 g. of 4-(dimethylvinylsilyl)-benzoyl chloride and 0.34 g. of benzoyl chloride, there was obtained 1.61 g. of polymer in the same way as in Example 53. The silicon content of the polymer was analyzed to be 9.6%.

The polymer proved to have the following sensitivity characteristics.

$Q_{0.5} = 1.7 \times 10^{-6}$ coulomb/cm$^2$
$\gamma_{0.5} = 0.93$

Main absorptions in infrared spectrum were as follows. (unit: cm$^{-1}$): 700, 720, 760, 780, 820, 840, 950, 1000, 1020, 1095, 1120, 1190, 1250, 1390, 1400, 1450, 1500, 1550, 1600, 1720, 2950, 3050.

EXAMPLE 55

Using 500 mg of the same polyvinyl alcohol as that used in Example 53, 1.65 g. of 4-(dimethylvinylsilyl)-benzoyl chloride and 0.69 g. of benzoyl chloride, there was obtained 1.49 g. of polymer by the same reaction as that conducted in Example 53. The silicon content of the polymer was analyzed to be 8.0%.

The polymer proved to have the following sensitivity characteristics.

$Q_{0.5} = 1.91 \times 10^{-7}$ coulomb/cm$^2$
$\gamma_{0.5} = 0.92$

Main absorptions in infrared spectrum were as follows. (unit: cm$^{-1}$): 710, 760, 780, 820, 840, 950, 1020, 1090, 1190, 1250, 1390, 1450, 1495, 1555, 1600, 1720, 2950, 3050.

EXAMPLE 56

798 g. of polyvinyl alcohol (Gohsenol KP-08, a product of the Nippon Synthetic Chemical Industry Co., with a saponification degree of 71.0 to 75.0 mole %) was suspended in 20 ml of pyridine, and 4.10 g. of 4-(dimethylvinylsilyl)benzoyl chloride was dropwise added with stirring at room temperature over a period of 20 minutes. After stirring for 24 hours at room temperature, 20 ml of acetone was added followed by filtration under reduced pressure, then acetone was distilled out of the mother liquor under reduced pressure and the residue was poured into 400 ml of an aqueous 1 N sodium hydroxide solution. Then after stirring for 1 hour, a mass of polymer was taken out, crushed in water by a mixer and filtered under reduced pressure. Washing with methanol and drying under reduced pressure yielded 2.04 g. of a powdered colorless polymer. The silicon content of the polymer was analyzed to be 10.2%.

The polymer proved to have the following sensitivity characteristics.

$Q_{0.5} = 9.6 \times 10^{-7}$ coulomb/cm$^2$
$\gamma_{0.5} = 0.95$

Main absorptions in infrared spectrum were as follows. (unit: cm$^{-1}$): 700, 720, 750, 760, 780, 820, 940, 950, 1010, 1020, 1090, 1120, 1190, 1270, 1390, 1500, 1555, 1600, 1720, 2950, 3050.

We claim:

1. A resist material capable of forming a negative image by application of radiation, said material comprising an organic polymer with branches at least some of which contain vinyl silyl groups and are represented by the formula

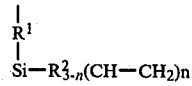

wherein R$^1$ is a divalent organic bonding, R$^2$ is a monovalent organic group other than vinyl group and n is an integer of 1 to 3.

2. The resist material as defined in claim 1, in which said polymer contains at least $3 \times 10^{-5}$ equivalent per gram thereof of vinyl silyl group-containing branches as vinyl groups attached to silicon atoms.

3. The resist material as defined in claim 1, in which the weight average molecular weight of said polymer is at least 2,000.

4. The resist material as defined in claim 1, in which said R$^1$ is Z-R$^3$ where Z, which is bonded to the main polymer chain, is —COO—, —OCO—, —CONH—, —CH$_2$OCO— or —OCH$_2$CH$_2$OCO—, and R$^3$ is —CH$_2$—$_{1-8}$, —CH=CH—, —C≡C—, —CH$_2$—C≡C—,

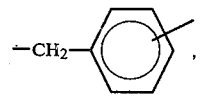

phenylene, or any of these bondings with hydrogens partially substituted by alkyl or aryl group.

5. The resist material as defined in claim 1, in which the main polymer chain of said polymer comprises carbonaceous chain, polyether, polyimine, polysulfide, polyamide, polyester, polyurethane, polycarbonate, polyurea, cellulose, amylose, or dextrane.

* * * * *